United States Patent [19]
Miller

[11] Patent Number: 4,974,204
[45] Date of Patent: Nov. 27, 1990

[54] NON-VOLATILE PROGRAMMABLE INTERCONNECTION CIRCUIT

[75] Inventor: William D. Miller, Cupertino, Calif.

[73] Assignee: National Semiconductor Corporation, Santa Clara, Calif.

[21] Appl. No.: 405,431

[22] Filed: Aug. 28, 1989

[51] Int. Cl.$^5$ ............................................. G11C 11/22
[52] U.S. Cl. ..................................... 365/145; 365/228
[58] Field of Search ............... 365/117, 145, 149, 154, 365/228

[56] References Cited

U.S. PATENT DOCUMENTS

| | | | |
|---|---|---|---|
| 4,499,560 | 2/1985 | Brice | 365/228 |
| 4,809,225 | 2/1989 | Dimmler et al. | 365/145 |
| 4,853,893 | 8/1989 | Eaton, Jr. et al. | 365/145 |

Primary Examiner—Joseph A. Popek
Attorney, Agent, or Firm—Richards, Medlock & Andrews

[57] ABSTRACT

A programmable interconnection circuit includes first and second ferroelectric capacitors which differentially store the programming state of the circuit. A principal application of the circuit is in the programming of cells within a gate array integrated circuit. The programmable circuit is non-volatile due to the storage of polarization state within the ferroelectric capacitors. Differential voltage states are applied to programming nodes which set the state of a cross-coupled amplifier that, in turn, drives p-channel and n-channel transistors which are connected between first and second nodes of the integrated circuit. A drive line signal applied to terminals of the ferroelectric capacitors goes between high and low voltage states to set differential polarization states into the capacitors. Following restoration of power to the integrated circuit, which includes the programmable circuit, a pulse is applied through the drive line to the ferroelectric capacitors to create differing voltages at the program nodes. These different voltages are differentially amplified to produce the required voltage states to reestablish the programmed interconnection for the circuit.

4 Claims, 1 Drawing Sheet

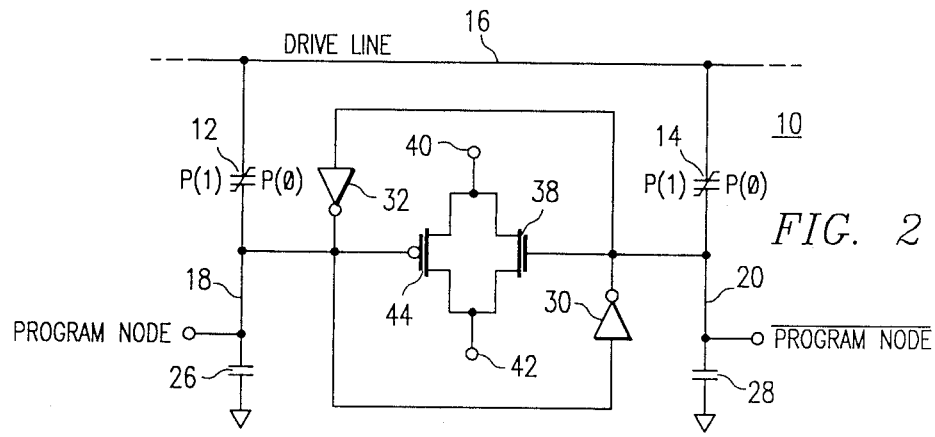
FIG. 2
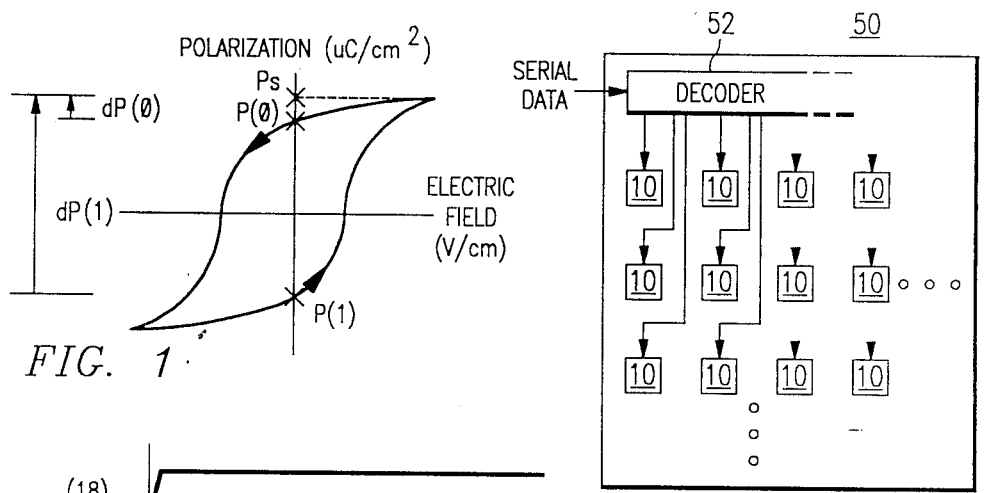
FIG. 1
FIG. 5
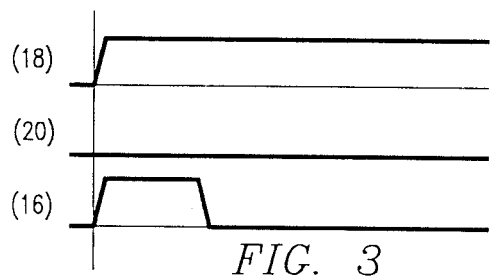
FIG. 3
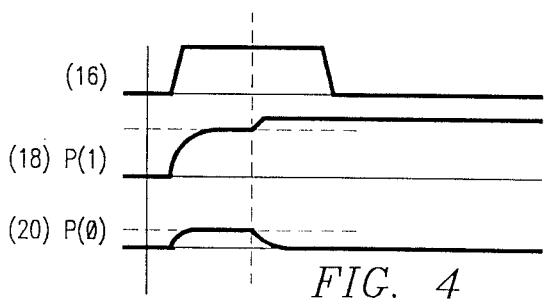
FIG. 4

NON-VOLATILE PROGRAMMABLE INTERCONNECTION CIRCUIT

FIELD OF THE INVENTION

The present invention pertains in general to non-volatile circuits and in particular to such circuits which are utilized to establish selected connections between nodes of an integrated circuit, such as a gate array.

BACKGROUND OF THE INVENTION

Gate array circuits and applications specific integrated circuits (ASIC) have become important technologies for commercial applications of integrated circuits. The basic economic justification for these technologies is that integrated circuits can be more easily designed by using an array of standard circuits connected in a unique configuration or a library of standard cells which can be selected and interconnected. As a result, the specific design process for an integrated circuit becomes a definition of the particular interconnection of standard circuits or cells. This is frequently done by designing a unique last metal layer in a fabrication step that interconnects the various circuits of the device. However, with such procedure the selection of a particular design is fixed with regard to that circuit, that is, it cannot be changed. A new design must be implemented in a new part, rather than making a change in an old part.

The present invention is directed to a method for establishing selected interconnections, open or closed, between circuit nodes of an integrated circuit. These interconnections are established in a programmable manner such that the set-up of the entire circuit is done upon receipt of a programming signal, rather than by physically applying a mask layer and etching that layer to form interconnections. The present invention further provides that the programmability is non-volatile so that the state of the programmed circuit is not affected by loss of power. Thus, with the present invention, a standard circuit can be converted into a unique design merely by the application of programming signals. Further, any changes in the design can be implemented by changing the programmed interconnections. Thus, the present invention reduces the design, and redesign costs for standard circuit-based integrated circuit.

SUMMARY OF THE INVENTION

A selected embodiment of the present invention is a programmable, non-volatile interconnection circuit for selectively connecting together first and second nodes of an integrated circuit. The interconnection circuit includes first and second ferroelectric capacitors each of which has first and second terminals. A drive line is connected to the first terminals of each of the ferroelectric capacitors. The circuit is provided with first and second programming nodes which are connected respectively to the second terminals of the ferroelectric capacitors. A p-channel field effect transistor has the source and drain terminals thereof connected between the first and second nodes. An n-channel field effect transistor has its source and drain terminals also connected between the first and second nodes. A cross-coupled amplifier is provided which has first and second differential inputs and produces therefrom first and second differential outputs. The first and second differential inputs are connected respectively to the second terminals of the ferroelectric capacitors. The first and second differential outputs are connected respectively to the gate terminals of the p-channel and n-channel transistors.

In accordance with the method of the present invention, a selected data state is input at the programming nodes as a differential signal. A drive signal having both a high state and a low state is input to the drive line to establish first and second polarization states respectively in the first and second ferroelectric capacitors. The programming voltages likewise set the state of a cross-coupled amplifier which has differential outputs that drive the p-channel and n-channel transistors to establish either an open or closed connection between the first and second nodes of the integrated circuit. This condition remains in effect for so long as power is supplied to the circuit or the programming status is not changed. Upon loss of power to the integrated circuit, the gate control signals for the p-channel and n-channel transistors is lost and the desired circuit connection will no longer be established. However, the state of the required interconnection will be maintained as information within the ferroelectric capacitors. Upon restoration of power to the integrated circuit, a pulse drive signal is applied to the first and second ferroelectric capacitors to establish different voltage states at the second terminals of the capacitors, the programming. The cross-coupled amplifier detects the different voltages and produces a corresponding differential output for driving the p-channel and n-channel transistors to reestablish the programmed interconnection state between the first and second nodes of the integrated circuit.

BRIEF DESCRIPTION OF THE DRAWINGS

For a more complete understanding of the present invention and the advantages thereof, reference is now made to the following Description taken in conjunction with the accompanying Drawings in which:

FIG. 1 is a hysteresis curve illustrating the polarization of a ferroelectric capacitor by an applied voltage;

FIG. 2 is a schematic diagram of a programmable, non-volatile interconnection circuit in accordance with the present invention;

FIG. 3 is a group of waveforms illustrating the programming action of the present invention;

FIG. 4 is a group of waveforms illustrating the restoration of the programmed interconnection state to the circuit of the present invention; and FIG. 5 is a schematic illustration of a gate array integrated circuit which has a decoder for programming non-volatile interconnection circuits.

DETAILED DESCRIPTION

It has long been recognized that ferroelectric capacitors can serve as memory elements in an electronic circuit. An early application of ferroelectric capacitors is shown in U.S. Pat. No. 2,695,396 to Anderson. Additional patents which show the use of ferroelectric elements for memory storage include U.S. Pat. Nos. 4,144,591 to Brody, 4,149,301 to Cook, and 4,360,896 to Brody. A ferroelectric capacitor stores information as a function of the polarization state within the capacitor. Ferroelectric capacitors do not necessarily include any ferrous materials but are so named because their operation is similar to that of magnetic materials. The polarization of the ferroelectric capacitor is much like the north and south polarization of a magnet.

Referring now to FIG. 1, there is shown a hysteresis curve illustrating the polarization of a ferroelectric capacitor. The horizontal parameter is the electric field applied to the ferroelectric capacitor. This is measured in volts per centimeter. The vertical axis is the resulting polarization state of the device represented in microcoulombs per square centimeter. For a zero applied electric field there are marked three polarization states. These are shown as P(1), P(0) and Ps. As positive and negative electric fields are applied to a ferroelectric capacitor, the resulting polarization is illustrated by the hysteresis curve shown in FIG. 1. The travel about the curve is done in the counter-clockwise direction shown by the arrows.

When a positive electric field is applied to a ferroelectric capacitor, the resulting polarization is likewise designated positive and this is represented by travel along the hysteresis curve in the upper right-hand quadrant. When the positive electric field is allowed to return to zero, the resulting polarization is designated as P(0). When a negative electric field is applied across the ferroelectric capacitor, the travel is in the counter-clockwise direction to the lower, left-hand quadrant. When the negative electric field is allowed to return to zero, the resulting polarization is indicated as P(1). The hysteresis curve shown in FIG. 1 is useful for understanding the operation of the circuit of the present invention.

Referring now to FIG. 2, there is illustrated a programmable interconnection circuit 10 in accordance with the present invention. The circuit 10 includes ferroelectric capacitors 12 and 14 which each have a first terminal thereof connected to a drive line 16. The second terminal of capacitor 12 is connected to a program node 18. The second terminal of capacitor 14 is connected to an inverse program node 20. The nodes 18 and 20 receive inverse signals.

A capacitor 26 is connected between the node 18 and a circuit ground and a capacitor 28 is connected between node 20 and circuit ground. The capacitors 26 and 28 are preferably parasitic capacitances which are associated with the nodes 18 and 20.

The program node 18 is connected to the input of an inverting amplifier 30 and the inverse program node 20 is connected to the input of an inverting amplifier 32. The amplifiers 30 and 32 taken together constitute a cross-coupled amplifier having the input to one connected to the output of the other. These amplifiers thus drive the nodes 18 and 20 to opposite voltage states.

The output of amplifier 30 is connected to the gate terminal of an n-channel field effect transistor 38. The source and drain terminals of transistor 38 are connected between integrated circuit nodes 40 and 42.

The output of amplifier 32 is connected to a gate terminal of a transistor 44 which has its source and drain terminals connected between nodes 40 and 42.

Operation of the present invention is now described in reference to FIGS. 1-4. The purpose of the present invention is to provide either a connection or an open circuit between the nodes 40 and 42. As noted above, these when in an integrated circuit, such as a gate array, can provide the customization necessary to produce a unique product from a standard gate array. The connection of selected nodes can also apply to other programmable circuits.

In the operation of the present invention, the first step is to establish a programmed state for the circuit 10. This is done by applying a data signal to the terminals 18 and 20. This is applied as a differential signal so that the nodes 18 and 20 are driven to opposite voltage states. In a selected embodiment of the present invention, the operating voltages are zero and +5. Thus, these two voltages are applied to the terminals 18 and 20. When these programming voltages are applied to the nodes 18 and 20 they serve to set the state of the cross-coupled amplifier, which comprises amplifiers 30 and 32. If, for example, a high voltage state is applied at node 18 and a low voltage state is applied at node 20, the high voltage state at node 18 will produce a low output from amplifier 30 which corresponds to the low voltage at node 20. This low voltage at node 20 serves to drive the output of amplifier 32 to a high state which corresponds to the voltage at node 18. Thus, the cross-coupled amplifier, comprising amplifiers 30 and 32, is set to a first of two possible states. If the voltages at nodes 18 and 20 are reversed, the state of the amplifiers 30 and 32 is likewise reversed. When the circuit 10 is in the state first described above, the transistors 38 and 44 are both turned off thereby providing an open circuit between the nodes 40 and 42. When the voltages at the programming nodes are reversed, the circuit 10 is set to a second state wherein the transistors 44 and 38 are turned on thereby connecting the nodes 40 and 42.

Ferroelectric capacitors 12 and 14 provide a nonvolatile memory storage for the circuit 10. Thus, when the integrated circuit, which includes the circuit 10 has the power applied to it terminated, the interconnection state required between the nodes 40 and 42 is not lost. The interconnection state is stored by the combination of inverse polarization states that are stored in the ferroelectric capacitors 12 and 14. This storage is carried out as shown in reference to FIGS. 1, 2 and 3. After the programming voltages have been established at the nodes 18 and 20, 18 high and 20 low in this example, a drive line signal is applied as shown by line 16 in FIG. 3. This is a high voltage pulse (+5 volts) followed by a low voltage. During the high voltage portion of the drive line signal, there is established a full voltage drop (5 volts) across the ferroelectric capacitor 14. This causes the capacitor 14 to be set to the P(0) polarization state as shown in FIG. 1. While the voltage on the drive line 16 is high, there is no net voltage across the ferroelectric capacitor 12. When the drive line 16 voltage drops to a low state, there is a negative voltage applied across the ferroelectric capacitor 12. This sets the polarization state of the capacitor 12 to be P(1) as shown in FIG. 1. Thus, the steps of polarizing the capacitors 12 and 14 establishes inverse polarization states therein. Upon loss of power to the circuit 10, these polarization states are not changed or lost.

Referring now to FIGS. 1, 2 and 4, there is illustrated the operation of the present invention upon restoration of power to the circuit 10. A pulse is applied to the drive line 16, as shown in FIG. 4, upon detecting power restoration. This pulse causes a net charge shift through the capacitors 12 and 14. However, the amplitude of charge which is shifted is dependent upon the polarization states stored in the capacitors. If a P(1) polarization state is stored in the ferroelectric capacitor 12, which is connected to the node 18, there is a greater charge transfer due to the increased travel along the hysteresis curve shown in FIG. 1. The ferroelectric capacitor 14 has a P(0) polarization state and as a result of application of a positive drive pulse, there is only a small net charge transfer across the capacitor. This is shown in the lower waveforms of FIG. 4. The charges transferred out of the capacitors 12 and 14 serve to establish voltages on the capacitors 26 and 28. Capacitors 26 and 28 are relatively small and are due to parasitic effects of the elements of the integrated circuit. The amount of charge transferred produces a corresponding amplitude of voltage. Thus, there are different voltages established on nodes 18 and 20. The cross-coupled amplifiers 30 and 32 serve to amplify the differences in these voltages and drive the nodes 18 and 20 to the full extremes between the available voltages, +5 and ground. For the present example, the node 18 has a slightly higher voltage than the node 20 after application of the pulse on the drive line 16. The higher voltage in node 18 tends to drive the output of the amplifier 30 to a lower voltage which, in turn, causes the amplifier 32 to still further increase the voltage at node 18. This feedback effect causes the nodes 18 and 20 to be rapidly snapped to opposite voltage states. This is illustrated in FIG. 4 after the vertical dashed line. After the extreme voltages are reestablished on the nodes 18 and 20 and line 16 has returned to ground, the same polarization action described above occurs to reestablish the previous polarization states in the ferroelectric capacitors 12 and 14.

Referring to FIG. 5, a gate array circuit 50 can incorporate a plurality of the circuits 10 of the present invention to establish programmed interconnections that define a unique circuit. The definition of the circuit can be provided by inputting a serial data signal to a decoder 52. The interconnection data is decoded and provided to each of the circuits 10. Thus, the gate array circuit 50, utilizing the circuit 10 of the present invention, can be "built" merely by applying a programming signal. Further, modifications to the circuit can be made easily by applying program change commands. Alternatively, the individual circuits 10 can be addressed within a gate array in the same manner that individual cells are addressed in a dynamic or static RAM memory.

I claim:

1. A method for operating a nonvolatile interconnection circuit which selectively connects first and second nodes of an integrated circuit, comprising the steps of:
   driving first and second programming nodes to differential voltage states, said first and second programming nodes connected to respective first terminals of first and second ferroelectric capacitors,
   applying both high and low voltage states to a drive line which is connected to second terminals of said ferroelectric capacitors thereby setting opposite polarization states in said ferroelectric capacitors,
   applying a pulse to said drive line to produce different voltage states at said first terminals of said ferroelectric capacitors, said different voltage states produced as a result of said opposite polarization states in said ferroelectric capacitors,
   differentially amplifying the voltages produced at said first terminals of said ferroelectric capacitors after said pulse is applied to said drive line to generate differential voltages, and
   applying said differential voltages at said first terminals respectively to the gate terminals of first and second opposite type field effect transistors which have the source and drain terminals thereof connected between said first and second nodes wherein a first state of said differential voltages turns on said transistors to connect said first and second nodes and a second state of said differential voltages turns off said transistors to open the connection between said first and second nodes.

2. A method for establishing a selected interconnection state between first and second nodes of an integrated circuit upon restoration of power to the integrated circuit, comprising the steps of:
   applying a pulse to a drive line which is connected to first terminals of first and second ferroelectric capacitors to produce different voltage states at second terminals of said ferroelectric capacitors, said different voltage states produced as a result of opposite polarization states previously set in said ferroelectric capacitors,
   differentially amplifying the voltages produced at said second terminals of said ferroelectric capacitors after said pulse is applied through said drive line to generate differential voltages, and
   applying said differential voltages at said second terminals respectively to the gate terminals of first and second opposite type field effect transistors which have the source and drain terminals thereof connected between said first and second nodes wherein a first state of said differential voltages turns on said transistors to connect said first and second nodes and a second state of said differential voltages turns off said transistors to open the connection between said first and second nodes.

3. A programmable, nonvolatile interconnection circuit for selectively connecting together first and second nodes of an integrated circuit, comprising:
   first and second ferroelectric capacitors, each having first and second terminals,
   a drive line connected to the first terminals of each of said ferroelectric capacitors,
   first and second programming nodes connected respectively to said second terminals of said ferroelectric capacitors,
   a gate circuit for connecting said first and second nodes upon receipt of a control signal at a control input thereof, and
   a cross-coupled amplifier having first and second differential inputs connected respectively to said second terminals of said ferroelectric capacitors, said amplifier for producing said control signal at an output thereof in response to a given voltage state at the input thereof and having the output thereof connected to said control input of said gate circuit.

4. A programmable, nonvolatile interconnection circuit for selectively connecting together first and second nodes of an integrated circuit, comprising:
   first and second ferroelectric capacitors, each having first and second terminals,
   a drive line connected to the first terminals of each of said ferroelectric capacitors,
   first and second programming nodes connected respectively to said second terminals of said ferroelectric capacitors,
   a p-channel field effect transistor having the source and drain terminals thereof connected between said first and second nodes,
   an n-channel field effect transistor having the source and drain terminals thereof connected between said first and second nodes, and
   a cross-coupled amplifier having first and second differential inputs and first and second differential outputs, said first and second differential inputs connected respectively to said second terminals of said ferroelectric capacitors, said first and second differential outputs connected respectively to the gate terminals of said p-channel and n-channel transistors.

* * * * *